(12) United States Patent
Kim

(10) Patent No.: US 6,372,565 B2
(45) Date of Patent: Apr. 16, 2002

(54) METHOD OF MANUFACTURING SRAM CELL

(75) Inventor: Jae-Kap Kim, Kyoungki-do (KR)

(73) Assignee: Hyundai Electronics Industries Co. Ltd., Kyoungki-do (KR)

( * ) Notice: Subject to any disclaimer, the term of this patent is extended or adjusted under 35 U.S.C. 154(b) by 0 days.

(21) Appl. No.: 09/756,060

(22) Filed: Jan. 8, 2001

Related U.S. Application Data

(62) Division of application No. 09/232,869, filed on Jan. 15, 1999, now Pat. No. 6,204,538, which is a division of application No. 08/882,312, filed on Jun. 25, 1997, now Pat. No. 5,907,502.

(30) Foreign Application Priority Data

Jun. 29, 1996 (KR) ............................................. 96-26312

(51) Int. Cl.[7] ............................................. H01L 21/8238
(52) U.S. Cl. ..................... 438/200; 438/155; 438/238; 438/241
(58) Field of Search ................................ 438/199, 200, 438/210, 238, 241, 306, 149, 152, 154, 155

(56) References Cited

U.S. PATENT DOCUMENTS

| | | | |
|---|---|---|---|
| 5,225,693 A | | 7/1993 | Hirayama .................... 257/204 |
| 5,330,929 A | * | 7/1994 | Pfiester et al. ............... 438/152 |
| 5,373,170 A | | 12/1994 | Pfiester et al. ................ 257/69 |
| 5,376,816 A | * | 12/1994 | Nishigoori et al. .......... 257/371 |
| 5,394,358 A | | 2/1995 | Huang .......................... 365/182 |
| 5,489,544 A | * | 2/1996 | Rajeevakumar .............. 438/244 |
| 5,491,654 A | | 2/1996 | Azuma ........................ 365/156 |
| 5,731,219 A | * | 3/1998 | Ikeda et al. .................. 438/238 |
| 5,851,869 A | * | 12/1998 | Urayama ..................... 438/238 |

FOREIGN PATENT DOCUMENTS

JP 58130560 8/1993

OTHER PUBLICATIONS

J. Uyemura, "Fundamentals of MOS Digital Integrated Circuits", Addison–Wesley Publishing Co, 1988, p. 586.
J. Millman et al, "Microelectronics", 2nd Ed., McGraw Hill Book Co., International Editions, 1988, pp. 356–358.

* cited by examiner

*Primary Examiner*—Kevin M. Picardat

(57) ABSTRACT

The present invention discloses a static random access memory cell having a reduced cell size and method of manufacturing the same. According to the invention, the SRAM cell includes: a word line and a bit line; an access device connected to the word and bit lines, wherein in case that the word line is selected, the access device outputs data inputted from the bit line; a pull-up device connected to the access device as well as to a predetermined power voltage, wherein the pull-up device operates in pull-up manner according to the data inputted from the access device; and a pull-down device connected to the access device and the pull-up device as well as to a ground, wherein the pull-down device operates in pull-down manner according to the data inputted from the access devices.

2 Claims, 4 Drawing Sheets

METHOD OF MANUFACTURING SRAM CELL

CROSS-REFERENCE TO RELATED APPLICATION

This application is a divisional of U.S. patent application Ser. No. 09/232,869, filed Jan. 15, 1999 now U.S. Pat. No. 6,204,538, which itself is a divisional of U.S. patent application Ser. No. 08/882,312, filed Jun. 25, 1997, now U.S. Pat. No. 5,907,502.

BACKGROUND OF THE INVENTION

1. Field of the Invention

The present invention relates to a semiconductor memory device and method of manufacturing the same, and more particularly, to a static random access memory cell having a reduced cell size and method of manufacturing the same.

2. Discussion of Related Art

A SRAM is a significant memory device due to its high speed, low power consumption, and simple operation. The memory cell of the SRAM is constituted of flip-flop circuit. In addition, unlike a DRAM, the SRAM does not need to regularly refresh the stored data and has a straight forward design. The SRAM cell includes: two pull-up devices; two access devices; and two pull-down devices. The SRAM cell is further classified as a full CMOS cell, a high road resistor (HRL), or thin film transistor (TFT) cell according to the load types of the pull-up device.

The TFT cell utilizes P-channel TFT as the pull-up device and it is being developed in 4 Mb or 16 Mb SRAM cell. The SRAM cell with TFT cell structure has low power consumption and a good stability during a stand-by operation in contrast to the SRAM cell with HRL cell structure. In addition, it has outstanding degree of high integration in contrast to the SRAM cell with the full CMOS cell structure having a bulk structure. As the SRAM cell with TFT cell structure, however, has a complex manufacturing process, the SRAM cell with full CMOS cell structure is manufactured to a higher degree. In contrast to the SRAM cell with TFT cell structure, the SRAM cell with the full CMOS cell structure has the simple manufacturing process. In addition, the SRAM cell with the full CMOS cell structure has high current during its operation and good stability.

FIG. 1 is a conventional circuit diagram of a SRAM cell with full CMOS cell structure. In FIG. 1, WL denotes a word line, and BL1 and BL2 denote bit lines. N1 and N2 denote nodes, and VDD is a power voltage. VSS is a ground voltage. UT1 and UT2 are pull-up transistors that comprise a P-channel MOS (PMOS) transistor. DT1 and DT2 are pull-down transistors that comprise N channel MOS (NMOS) transistor. AT1 and AT2 are access transistors that comprise the NMOS transistor.

A first CMOS inverter includes the PMOS transistor for use in the pull-up transistor UT1, and the NMOS transistor for use in pull-down transistor DT1. A second CMOS inverter includes the PMOS transistor for use in the pull-up transistor UT2 and the NMOS transistor for use in the pull-down transistor DT2. An output of the first CMOS inverter is connected with an input of the second CMOS inverter at the node N1. An input of the first CMOS inverter is connected with an output of the second CMOS inverter at the node N2. The sources of the NMOS transistors for use in the access transistors AT1 and AT2, are respectively connected to the bit lines BL1 and BL2, drains of the above NMOS transistors respectively connected to the nodes N1 and N2, and gates the above NMOS transistors respectively connected to the word line WL.

In the above-described SRAM cell with full CMOS cell structure, however, its unit cell is constituted of four NMOS transistors and two PMOS transistors, so that its cell size is large. Accordingly, as the SRAM cell with full CMOS cell structure has difficulty in reducing the cell size below a predetermined level, and it is difficult to manufacture a highly integrated memory device.

SUMMARY OF THE INVENTION

Accordingly, an object of the present invention is to provide an SRAM cell which can reduce the number of transistors constituting a memory cell thereby realizing higher integration of memory device, and a method of manufacturing the same.

To achieve the above objects, a SRAM cell according to the present invention includes: a word line and a bit line; an access device connected to the word and bit lines, wherein in case that the word line is selected, the access device outputs data inputted from the bit line; a pull-up device connected to the access device as well as to a predetermined power voltage, wherein the pull-up device operates in pull-up manner according to data inputted from the access device; and a pull-down device connected to the access device and the pull-up device as well as to a ground, wherein the pull-down device operates in pull-down manner according to data inputted from the access devices.

In this embodiment, the access device is an NMOS transistor, the pull-up device is an NMOS transistor, and the pull-down device is a PMOS transistor.

Furthermore, according to the present invention, there is provided a SRAM cell comprising: a semiconductor substrate, wherein a first and a second conductivity type wells are formed therein, a first active region is defined in the well of the first conductivity type and a second active region is defined in the well of the second conductivity type, by the field oxide layer; a gate insulating layer formed on the first and second active regions; first and second gates formed on the first active region and a third gate formed on the second active region; impurity diffusion regions of the second conductivity type formed in the first active region of both sides of each of the first and second gates, wherein the one of the impurity diffusion regions is a common region; impurity diffusion regions of the first conductivity type formed in the second active region of both sides of the third gate; an intermediate insulating layer formed on the overall substrate and having contact holes which expose predetermined portions of the impurity diffusion regions of the first and second conductivity types, predetermined portions of the second gate adjacent to the common impurity diffusion region of the second conductivity type, and predetermined portions of one side of the third gate; and metal interconnection layers each being in contact to the impurity diffusion regions of the first and second conductivity types and the second and third gates, through the contact holes.

Furthermore, the SRAM cell according to the present invention is fabricated by following process. A semiconductor substrate is provided. A first and a second conductivity type wells are formed in the substrate; Isolating layers are formed to define a first active region in the first conductivity well and a second active region in the second conductivity well. A gate insulating layer is formed on the first and second active regions. First and second gates are formed on the first active region which has the gate insulating layer formed thereon, and a third gate on the second active region which has the gate insulating layer formed thereon. Impurity diffusion regions of the second conductivity type are formed in the first active region of both sides of each of the first and second gates so that the one of the impurity diffusion regions is common between the first and second gates. Impurity diffusion regions of the first conductivity type are formed in the second active region of both sides of the third gate. An intermediate insulating layer is formed on the overall substrate. The intermediate insulating layer is etched to expose predetermined portions of each of the impurity diffusion regions of the first and second conductivity types, a predetermined portion of the second gate adjacent to the common impurity diffusion region of the second conductivity type, and a predetermined portion of the third gate to one side, thereby forming contact holes. A metal layer is deposited to filling the contact holes on the intermediate layer. Metal interconnection layers are formed to contact the impurity diffusion regions of the first and second conductivity types and the second and third gates by patterning the metal layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF PREFERRED EMBODIMENT

A preferred embodiment according to the present invention is described below with reference the attached drawings.

Figure 1:
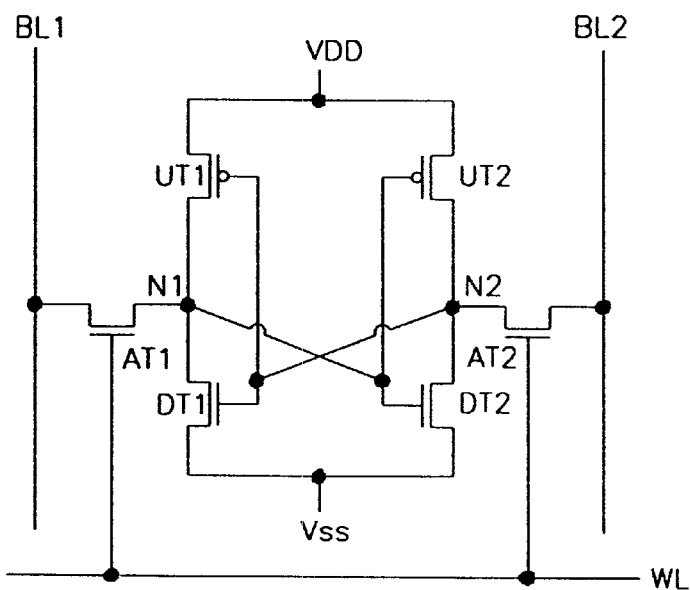
FIG. 1 is an equivalent circuit diagram of a conventional SRAM cell with full CMOS cell structure.
Figure 2:
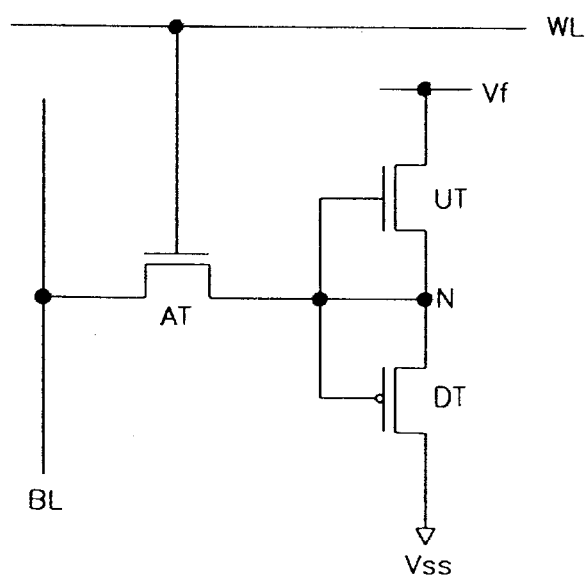
FIG. 2 is an equivalent circuit diagram of the SRAM cell with the full CMOS cell structure according to an embodiment of the present invention.

As illustrated in FIG. 2, the SRAM cell according to the present invention is constituted of three transistors.

In FIG. 2, WL is a word line, BL is a bit line, and UT is a pull-up transistor made of a NMOS transistor. Vf is a predetermined power voltage, and VSS is a ground voltage. DT is a pull-down transistor made of PMOS transistor. AT is the access transistor made of the NMOS transistor, and N is a node.

The sources of the NMOS transistor for use in pull-up transistor UT, of the PMOS transistor for use in the pull-down transistor DT, and of the NMOS transistor for use in the access transistor AT are connected to one another at the node N. The gates of the pull-up transistor UT and the pull-down transistor DT are connected to the node N. A predetermined power voltage Vf is applied to the drain of the pull-up transistor UT. Drain of the pull-down transistor DT is grounded to VSS. The Gate of the access transistor AT is connected to the word line WL, and the drain thereof is connected to the bit line BL.

In the above described SRAM cell, an operation to store data in a HIGH state at node N is as follows. In case that the word line WL is turned on and voltage in HIGH level is input to the bit line BL, the pull-down transistor DT is turned off and the pull-up transistor UT is turned on. Therefore, data at a HIGH state is stored at node N. Here, the voltage of the predetermined power voltage Vf is higher, as a threshold voltage of the pull-up transistor UT, than that which is applied to the bit line BL a threshold voltage of the pull-up transistor UT. In case that the word line WL is turned on and data in a LOW state is input to the bit line BL to store data in a LOW state, the pull-up transistor UT is turned off and the pull-down transistor DT is turned on. Therefore, data in a LOW state is stored at the node N.

Figure 3:
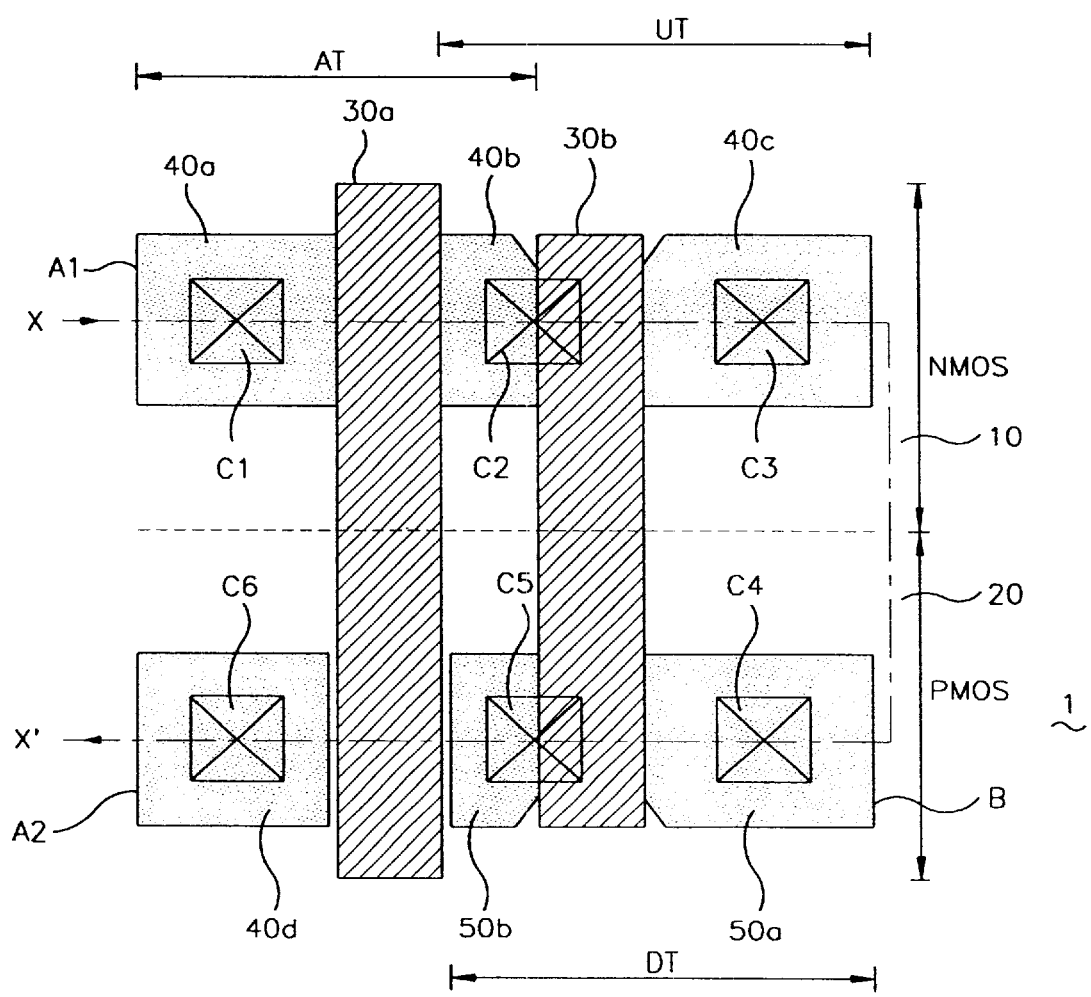
FIG. 3 is a layout of the SRAM cell with the full CMOS cell structure according to an embodiment of the present invention.

In FIG. 3, reference numeral 10 denotes a P well and reference numeral 20 denotes N well. A1, A2 and B are active regions, 30a and 30b are gate line. 40a to 40d are N⁺ impurity diffusion regions and 50a and 50b are P⁺ impurity diffusion regions. C1 to C6 are contact regions.

As illustrated in FIG. 3, in the SRAM cell, a P well 10 and a N well 20 are joined and horizontally extended alongside each other on the substrate 1. The active region A1 is horizontally disposed at the P well 10. The active region A2 and B are disposed at the N well 20 at a predetermined interval from each other to be parallel to the active region A1. The gate (word line) 30b is disposed in a perpendicular direction to partly cover the active region A1. The gate (word line) 30a is vertically arranged to thereby cross the active region A1 and pass through the N well 20 between the active-region A2 and B. N⁺ impurity diffusion regions 40a to 40d are formed in the active region A1 on both sides of each gate (word line) 30a and 30b and the active region A2. 40a and 40c become drain regions and 40b becomes common source region of the access transistor AT and the pull-up transistor UT, so that NMOS transistors for use in the access transistor AT and the pull-up transistor UT are achieved. 40d is a N well junction region. P⁺ impurity diffusion regions 50a and 50b are formed in the active region A2 on both sides of the gate 30b. 50a becomes a drain region, 50b becomes a source region thereby achieving the pull-down PMOS transistor DT. C1 to C6 are contact regions. C1 is the contact region of the drain region 40a of the access transistor AT, and the bit line (refer to FIG. 2). C2 is the contact region of the common source 40b of the access transistor AT and the pull-up transistor UT, and the gate 30b. C3 is the contact region of the drain 40c of the pull-up transistor UT and the predetermined power voltage (refer to FIG. 2). C4 is the contact region of the drain 50a of the pull-down transistor DT and the ground voltage (refer to FIG. 2) C5 is the contact region of the source 50b of the pull-down transistor DT and the gate 30b. C6 is the contact region of the N well junction region 40d and the power voltage (not shown). The common source region 40b of the access transistor AT and pull-up transistor UT is connected to the source region 50b of the pull-down transistor DT by the contact regions C2 and C5.

Figure 4A:
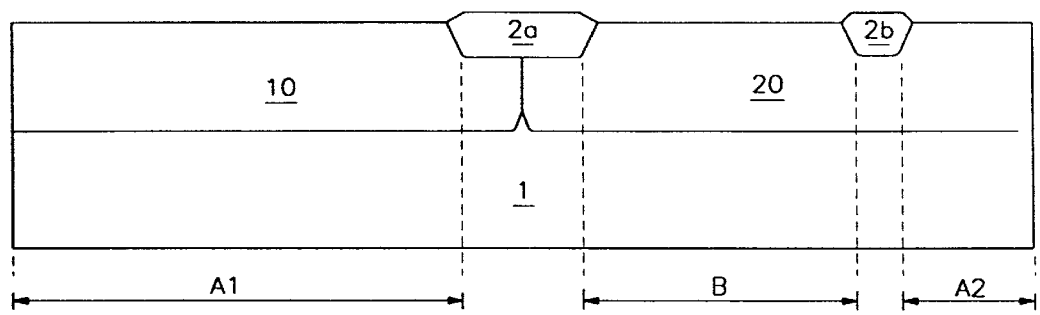
FIGS. 4A to 4C are cross sectional views showing a method of manufacturing the SRAM cell according to an embodiment of the present invention.
Figure 4B:
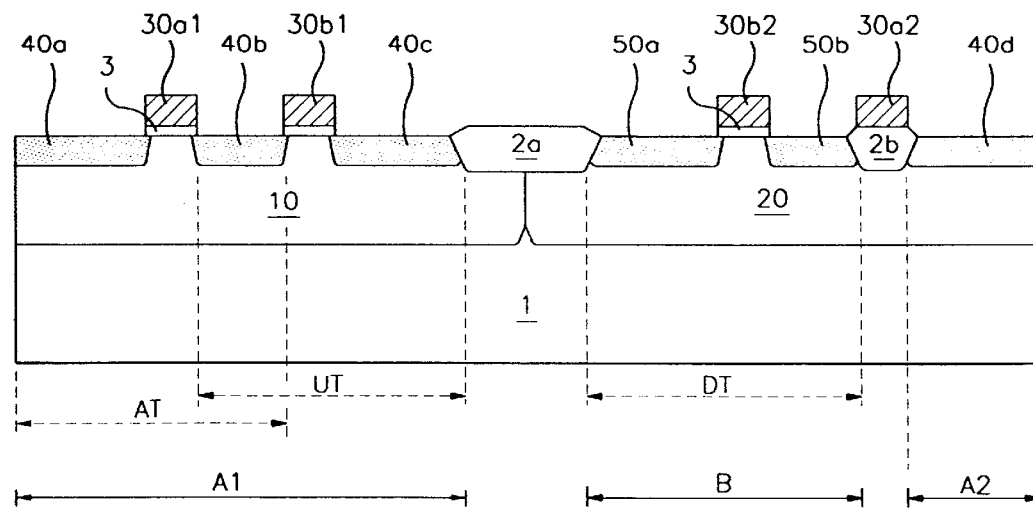
Figure 4C:
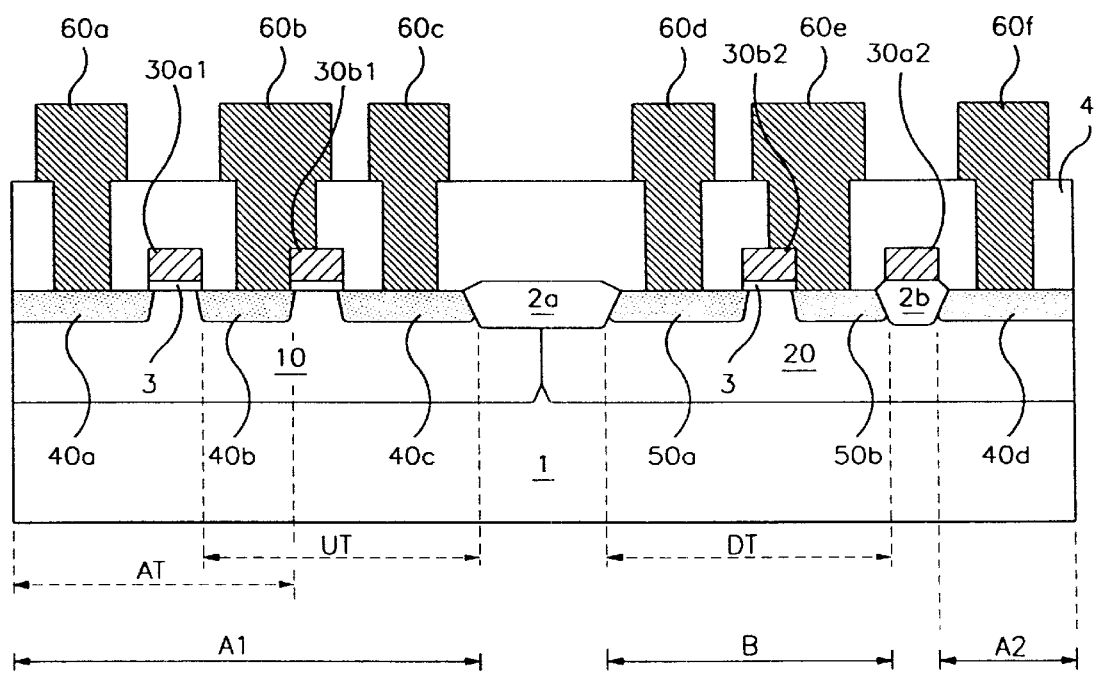

With reference to FIGS. 4A to 4C, a method for manufacturing the SRAM cell will be described below. FIGS. 4A to 4C are cross sectional views of FIG. 3 taken along lines X–X'. Reference numeral 2 denotes a field oxide layer, 3 is a gate insulating layer, and 4 is an intermediate insulating layer.

As illustrated in FIG. 4A, P well 10 and N well 20 are formed in the semiconductor substrate 1. The field oxide layers 2a and 2b are formed on the substrate 1 by the well-known LOCOS (LOCal Oxidation of Silicon) method. Therefore, the active region A1 of the access transistor AT is defined in the P well 10, and the active regions B and A2 are defined in the N well 20.

As illustrated in FIG. 4B, the gate insulating layer and the polysilicon layer are sequentially deposited and patterned on the structure of FIG. 4A. Therefore, the gate insulating layer 3 and the gates 30a1, 30b1 and 30b2 are formed on the active regions A1 and A2, and the gate 30a2 is formed on the field oxide layer 2b. A $N^+$ impurity ion is implanted into the active regions A1 and A2 of both sides of the gates 30a1 and 30a2, so that the $N^+$ impurity diffusion regions 40a to 40d are formed. 40a and 40c become each drain regions, and 40d becomes the common source region, thereby forming the NMOS transistors of which source is common. 40d becomes the N well junction region. Thereafter, $P^+$ impurity ions are implanted into the active region B of both sides of the gate 30b, so that the $P^+$ impurity diffusion regions 50a and 50b are formed. 50a becomes a drain and 50b becomes a source, so that the PMOS transistor for use in the pull-down transistor DT is achieved.

As illustrated in FIG. 4C, the intermediate insulating layer 4 is deposited on the structure of FIG. 4B. The intermediate insulating layer 4 is etched to expose the predetermined portions of the source regions 40a, 40b and 40c and drain region 50a and 50b and the N well junction region 40d, and to also expose the gates 30b1 and 30b2 of the pull-up transistor UT and the pull-down transistor DT, thereby forming the contact holes (not shown). Here, the etching of the intermediate layer 4 is carried out so that the gate 30b1 and source 40b of the pull-up transistor UT are exposed through a shared contact hole, and the gate 30b2 and source 50b of the pull-down transistor DT are also exposed through a shared contact hole.

A metal layer is deposited to fill the contact holes on the intermediate insulating layer 4 and then patterned, so that the metal interconnection layers 60a to 60f are formed. Accordingly, the gate 30b1 of the pull-up transistor UT and the source region 40b thereof are connected with each other, and the gate 30b2 of the pull-down transistor DT and the source region thereof are connected with each other.

According to the present invention, the SRAM cell with the full CMOS cell is realized with two NMOS transistors and one PMOS transistor, so that the cell size is reduced outstandingly. Accordingly, it is possible to realize the highly integrated SRAM cell.

It will be apparent to those skilled in the art that various modifications and variations can be made in the SRAM cell and manufacturing method thereof of the present invention without departing from the spirit or scope of the invention. Thus, it is intended that the present invention cover the modifications and variations of this invention provided they come within the scope of the appended claims and their equivalents.

What is claimed is:

1. A method of manufacturing SRAM cell, comprising the steps of:

providing a semiconductor substrate;

forming a first and a second conductivity type wells in the substrate;

forming isolating layers to define a first active region in the first conductivity well and a second active region in the second conductivity well;

forming a gate insulating layer on the first and second active regions;

forming first and second gates on the first active region which has the gate insulating layer formed thereon, and a third gate on the second active region which has the gate insulating layer formed thereon;

forming impurity diffusion regions of the second conductivity type in the first active region of both sides of each of the first and second gates so that the one of the impurity diffusion regions is common between the first and second gates; and forming impurity diffusion regions of the first conductivity type in the second active region of both sides of the third gate.

2. The method according to claim 1, further comprising the steps of:

forming an intermediate insulating layer on the overall substrate;

etching the intermediate insulating layer to expose predetermined portions of each of the impurity diffusion regions of the first and second conductivity types, a predetermined portion of the second gate adjacent to the common impurity diffusion region of the second conductivity type, and a predetermined portion of the third gate to one side, thereby forming contact holes;

depositing a metal layer to filling the contact holes on the intermediate layer; and forming metal interconnection layers to contact the impurity diffusion regions of the first and second conductivity types and the second and third gates by patterning the metal layer.

* * * * *